United States Patent
Miyamoto et al.

(10) Patent No.: US 10,234,991 B2
(45) Date of Patent: Mar. 19, 2019

(54) DISPLAY DEVICE

(71) Applicant: Japan Display Inc., Minato-ku (JP)

(72) Inventors: Mitsuhide Miyamoto, Minato-ku (JP);
Takayuki Nakanishi, Minato-ku (JP);
Hayato Kurasawa, Minato-ku (JP);
Hiroshi Mizuhashi, Minato-ku (JP);
Shuji Hayashi, Minato-ku (JP);
Yoshitoshi Kida, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 44 days.

(21) Appl. No.: 15/446,618

(22) Filed: Mar. 1, 2017

(65) Prior Publication Data
US 2017/0255330 A1  Sep. 7, 2017

(30) Foreign Application Priority Data

Mar. 7, 2016  (JP) .................................. 2016-043909

(51) Int. Cl.
| | |
|---|---|
| *G06F 3/041* | (2006.01) |
| *G06F 3/044* | (2006.01) |
| *G09G 3/3233* | (2016.01) |
| *G09G 3/3266* | (2016.01) |
| *H01L 27/32* | (2006.01) |

(52) U.S. Cl.
CPC ............ *G06F 3/0418* (2013.01); *G06F 3/044* (2013.01); *G06F 3/0412* (2013.01); *G06F 3/0416* (2013.01); *G09G 3/3233* (2013.01); *G09G 3/3266* (2013.01); *H01L 27/323* (2013.01); *H01L 27/3262* (2013.01); *H01L 27/3276* (2013.01); *G06F 2203/04111* (2013.01); *G06F 2203/04112* (2013.01); *G09G 2300/043* (2013.01); *G09G 2300/0426* (2013.01); *G09G 2300/0452* (2013.01); *G09G 2300/0814* (2013.01); *G09G 2300/0819* (2013.01)

(58) Field of Classification Search
None
See application file for complete search history.

(56) References Cited

U.S. PATENT DOCUMENTS

| | | | |
|---|---|---|---|
| 2012/0249401 A1 | 10/2012 | Omoto | |
| 2015/0185941 A1* | 7/2015 | Lee | ........................ G06F 3/0412 345/173 |

FOREIGN PATENT DOCUMENTS

JP         5778961         9/2015

\* cited by examiner

*Primary Examiner* — Christopher J Kohlman
(74) *Attorney, Agent, or Firm* — Oblon, McClelland, Maier & Neustadt, L.L.P.

(57) ABSTRACT

A display device includes a plurality of scanning lines provided over an insulating surface, a plurality of video signal lines provided, intersecting with the plurality of scanning lines, a display area including a plurality of pixels, each having a light emitting element and a transistor for controlling a current supplied to the light emitting element, provided at points of intersection between the plurality of scanning lines and the plurality of video signal lines, and a touch sensor provided over the display area and having a drive electrode and a detection electrode which form an electrostatic capacitance with each other.

10 Claims, 10 Drawing Sheets

DISPLAY DEVICE

CROSS-REFERENCE TO RELATED APPLICATION

The present application claims priority from Japanese application JP2016-043909 filed on Mar. 7, 2016, the content of which is hereby incorporated by reference into this application.

BACKGROUND OF THE INVENTION

1. Field of the Invention

The present invention relates to a display device. Particularly the invention relates to a display device equipped with a touch sensor over a display area where an organic EL element is formed.

2. Description of the Related Art

It is demanded that a display device for a mobile device should be reduced in thickness and weight. In view of this, when a liquid crystal display device and an organic EL display device are compared, the organic EL display device is considered more advantageous in that it needs no backlight. Also, as the development of techniques for forming a pixel drive circuit and an organic EL element on a flexible substrate has been underway, a thinner and lighter display than a conventional display using a glass substrate has been realized. In this course of events, a reduction in thickness of members other than the display device, such as the touch sensor and the polarizer, is demanded as well. Particularly, the thickness increases if the touch sensor is bonded and mounted on the display device as a separate member. Therefore, a touch sensor as a built-in member of the display device is demanded.

A method for providing a built-in touch sensor in the organic EL display device is disclosed in Japanese Patent No. 5,778,961. According to this invention, it is disclosed that one of the electrodes forming the organic EL element is formed in the shape of a band and used as an electrode of the touch sensor.

SUMMARY OF THE INVENTION

Providing the built-in touch sensor in the organic EL display device raises new problems. One of these problems is that, due to the shorter distance between the electrode of the touch sensor and the organic EL element, the noise caused by the signal input to and circuit operation of a pixel drive circuit which drives the organic EL element may increase. This causes a reduction in S/N ratio of the touch sensor and deterioration in sensing performance.

To cope with this, it is conceivable that a period for writing a video signal and a period for detecting a touch are separated within a vertical scanning period. As the respective operations are performed in a time-divisional manner, the noise due to the signal input to and the circuit operation of the pixel drive circuit can be avoided, thus enabling improvement in S/N ratio. However, as the image display device has increasingly higher definition, the time required for writing a video signal to the pixel increases. Moreover, in the organic EL display device, a special operation such as correcting a threshold variance of the drive transistor may be needed separately. Therefore, it is difficult to separate the period for writing a video signal and the period for detecting a touch and complete each period, as described above.

In view of the foregoing circumstances, the invention is to provide a display device which can secure a sufficient S/N ratio and realize normal image display and touch detection even in the case where a built-in touch sensor is provided in a high-definition display device.

A display device includes a plurality of scanning lines provided over an insulating surface, a plurality of video signal lines provided, intersecting with the plurality of scanning lines, a display area including a plurality of pixels, each having a light emitting element and a transistor for controlling a current supplied to the light emitting element, provided at points of intersection between the plurality of scanning lines and the plurality of video signal lines, and a touch sensor provided over the display area and having a drive electrode and a detection electrode which form an electrostatic capacitance with each other. Between a period during which one row of the plurality of scanning lines is selected and a period during which a next row is selected in the display area, a touch detection period is provided in which a drive signal having a rise or fall is inputted to the drive electrode in the touch sensor and in which potential fluctuation at the detection electrode is acquired. During the touch detection period, each of the plurality of scanning lines and the plurality of video signals lines has a constant potential.

DETAILED DESCRIPTION OF THE INVENTION

Hereinafter, each embodiment of the invention will be described with reference to the drawings. In the drawings, the width, thickness, shape and the like of each part may be schematically illustrated, compared with the actual configuration, in order to clarify the explanation. However, such illustrations are simply an example and should not limit the interpretation of the invention. Also, in the specification and the drawings, components similar to those described before in drawings that are already mentioned may be denoted by the same reference signs and not described further in detail.

In the invention, when describing a configuration in which one structure is arranged over another structure, if simply the term "over" is used, it includes both the case where one structure is arranged directly upward from and in contact with another structure and the case where one structure is arranged above the another structure with still another structure in-between, unless stated otherwise.

Figure 1:
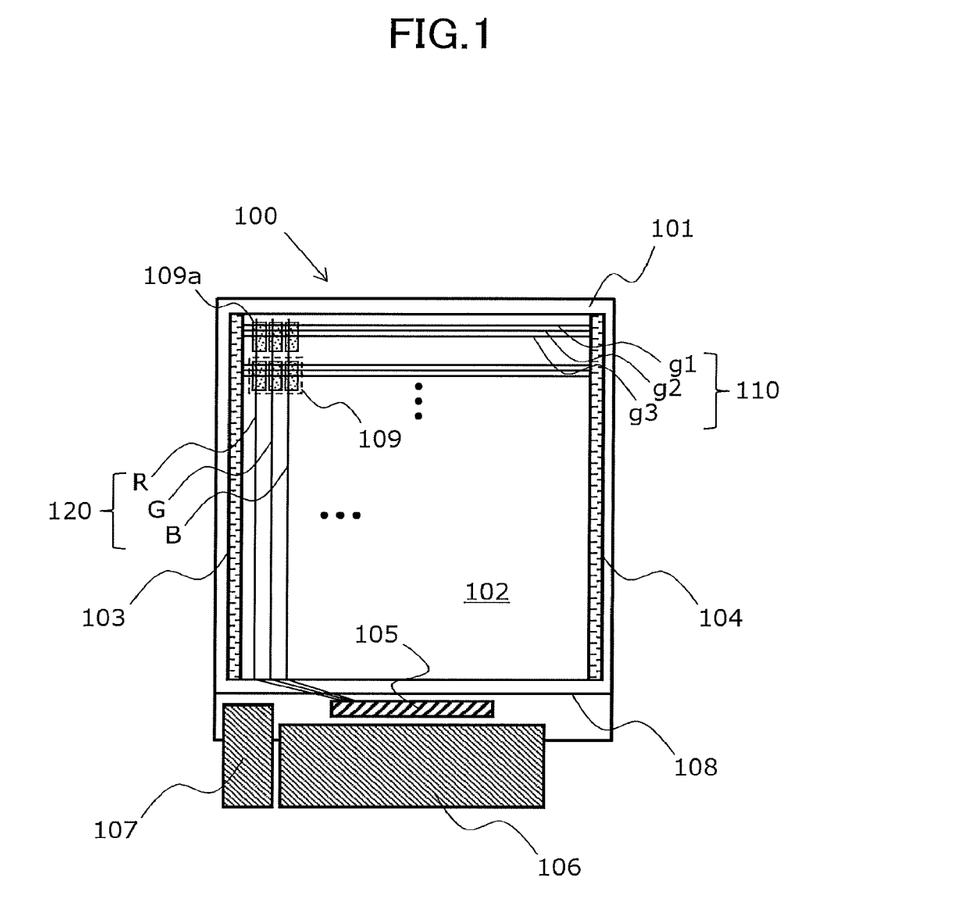
FIG. 1 schematically shows a display device according to the invention.

FIG. 1 shows an example of the configuration of a display device according to the invention. In a display device 100, a display area 102 and scanning line drive circuits 103, 104 are formed over a substrate 101, and a drive IC 105, a display FPC (flexible printed circuit board) 106, and a touch FPC 107 are connected to the substrate 101. In FIG. 1, the drive IC 105 is mounted over the substrate 101. However, the drive IC 105 may also be mounted over the display FPC 106. Also, a counter substrate 108 may be provided in such a way as to cover the display area 102. In the display area 102, a plurality of scanning lines laid in the direction of row (in FIG. 1, horizontal direction) and a plurality of video signal lines laid in the direction of column (in FIG. 1, vertical direction) are arranged. A subpixel 109a is arranged at the intersection of a scanning line and a video signal line. Each subpixel 109a has a light emitting element which emits light in a different color from other subpixels. A plurality of such subpixels 109a is gathered to form one pixel 109 (in FIG. 1, indicated by dotted-line frames), thus performing full-color display. In this example, three scanning lines 110 (g1, g2, g3) are arranged per line of pixels, and three video signal lines 120 (R, G, B) are arranged per column of pixels. Although not illustrated, wirings such as a power supply line for supplying a predetermined voltage to the light emitting elements are provided in the display area 102. In each subpixel 109a, a pixel circuit which controls the luminance of the light emitting element is provided so as to emit light with a luminance corresponding to a signal supplied from the drive IC 105 via the video signal line 120.

Figure 2A:
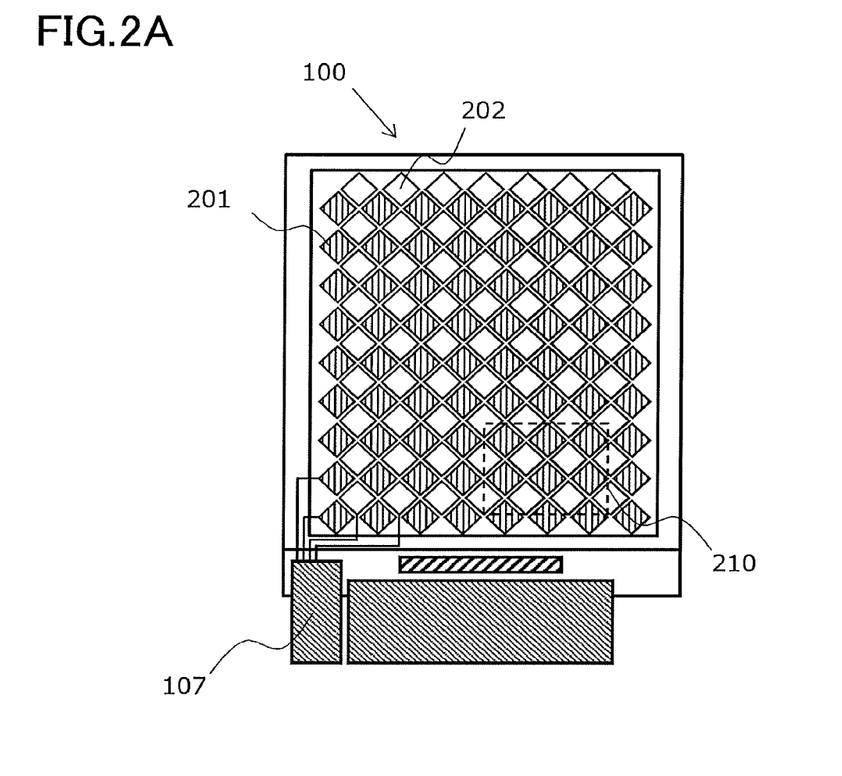
FIGS. 2A and 2B schematically show built-in touch electrodes in the display device according to the invention.

The display device 100 has a touch sensor in addition to the display function. Although the touch sensor is omitted from FIG. 1 in order to explain the display function in particular, the touch sensor is arranged in an upper layer of the light emitting element, that is, closer to the display surface side than the light emitting element, as shown in FIG. 2A. The touch sensor is made up of two kinds of electrodes, for example. One is a drive electrode 201 laid in the direction of row, and the other is a detection electrode 202 laid in the direction of column.

Figure 2B:
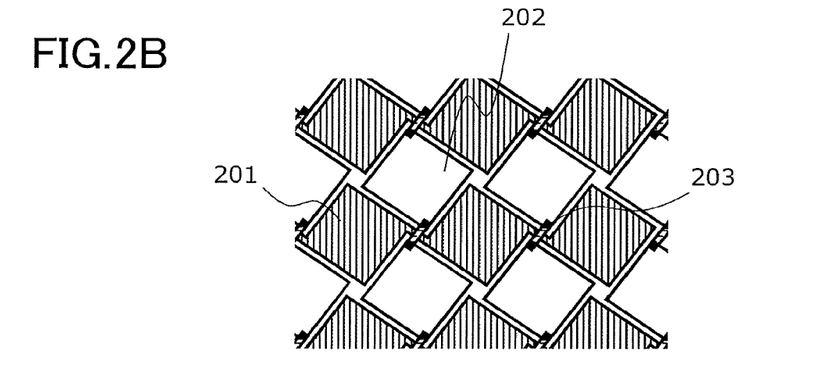

FIG. 2B shows an enlarged view of a dotted-line frame 210 shown in FIG. 2A. The drive electrodes 201 and the detection electrodes 202 are provided over the display area of the display device 100 and therefore formed of a transparent conductive film of ITO, IZO or the like. Other materials forming the transparent conductive film may include an Ag nanowire or the like. The Ag nanowire is a material formed by dispersing Ag in the form of fine fiber into a solvent, and can be formed by coating. Moreover, the space between electrodes of one kind is arranged over the electrodes of the other kind and therefore these electrodes are connected by a bridge wire 203 or the like. In FIG. 2B, the electrodes are rectangular. However, the drive electrodes 201 or the detection electrodes 202 may be formed thinly using a metal layer, thus securing an area through which the light of the light emitting element passes. When this touch sensor is touched at a predetermined position, the capacitance between the drive electrode and the detection electrode at that position changes, and this change in capacitance is detected, thus detecting the touched position. Each electrode is connected to an external detection circuit by the touch FPC 107.

Figure 3:
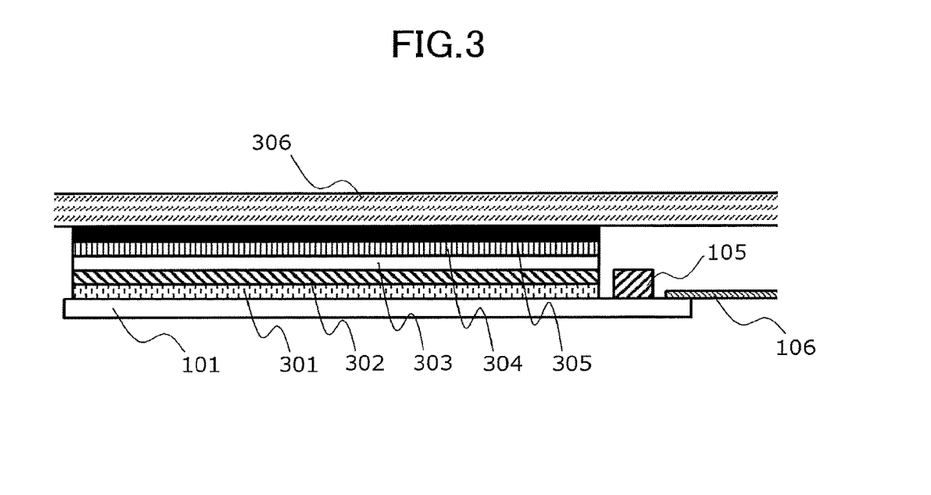
FIG. 3 shows the cross-sectional structure of the display device according to the invention.

FIG. 3 shows an example of the cross-sectional structure of the display device equipped with the touch sensor. From the bottom in FIG. 3, the substrate 101, a TFT array 301, a light emitting element layer 302, a sealing layer 303, a touch sensor 304, a circular polarizer 305, and a cover glass 306 are arranged. An adhesive layer that is needed in the case of bonding the respective layers is not described. The cover glass 306 extends not only over the display area but also over the area where the driver IC 105 and the display FPC 106 are mounted.

In this structure, the touch sensor 304 is arranged over the TFT array 301 and the light emitting element layer 302 via the sealing layer 303. In the case where the substrate on which the touch sensor 304 is formed is reduced in thickness or in the case where the drive electrode and the detection electrode of the touch sensor are formed directly on the sealing layer 303, the touch sensor 304, and the electrodes included in the TFT array 301 and the light emitting element layer 302 are arranged very closely to each other. Consequently, an electrically strong capacitive coupling is formed between the touch sensor 304 and these electrodes. With a display operation, various signals are inputted to the TFT array 301 and the internal circuit operates. However, these signals and changes in potential at the time of circuit operation cause a noise, thus lowering the S/N ratio of the touch sensor 304.

Figure 4:
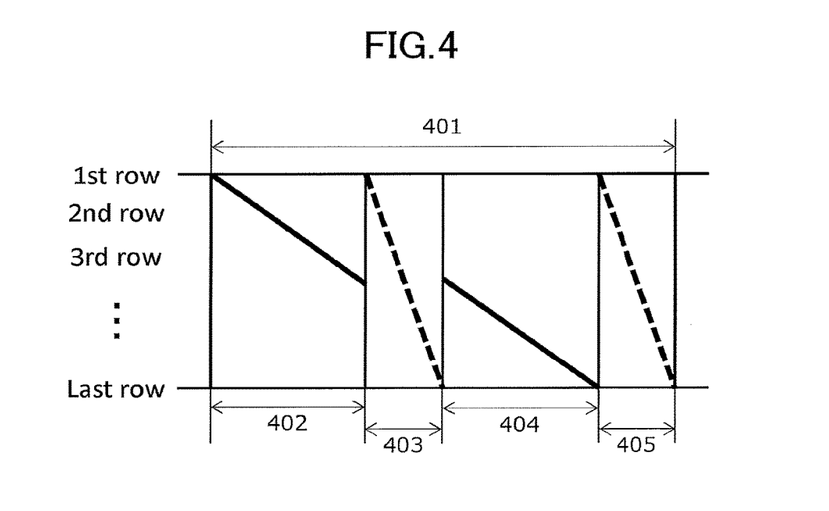
FIG. 4 shows a drive method for the display device.

As a measure to cope with this, conventionally, a method is employed in which one vertical scanning period is divided into video signal write periods and touch sensor drive periods and in which signals to the TFT array are stopped during the touch sensor drive periods, thus restraining the generation of a noise, as shown in FIG. 4, for example. In FIG. 4, one vertical scanning period 401 is divided into video signal write periods 402, 404 and touch sensor drive periods 403, 405. In the video signal write period 402, video signals are written onto the first row up to a row at a halfway point (for example, a half of the entirety), and in the subsequent touch sensor drive period 403, surface touch detection is carried out. In the subsequent video signal write period 404, video signals are written onto the remaining rows. In the final touch sensor drive period 405, surface touch detection is carried out again. That is, an example in which touch detection is carried out twice within one vertical scanning period is shown.

According to the method shown in FIG. 4, since the video signal write periods and the touch sensor drive period are completely separated in terms of time, a change in potential at the time of the operation of one circuit does not affect the other, as a noise. However, in order to secure the touch sensor drive periods within one vertical scanning period, the video signal write periods need to be completed within a short time. Particular in the organic EL display device, not only the writing of video signals but also the correction of variance of characteristics of the transistor of each subpixel may need to be carried out during the video signal write periods, and the display area has an increasingly higher definition as well. Therefore, it is very difficult to shorten the video signal write periods.

Figure 5:
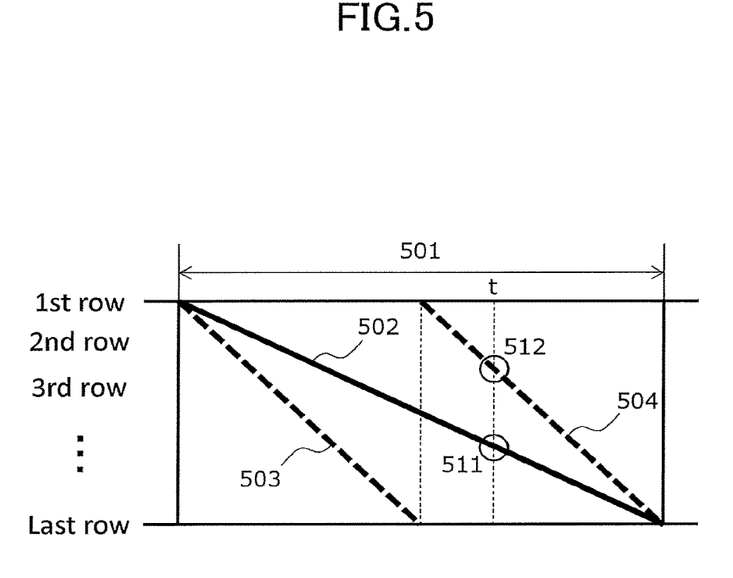
FIG. 5 shows a drive method for the display device.

Since the video signal write periods and the touch sensor drive periods are controlled by separate circuits, it is preferable that each operation is executed within the same period, as shown in FIG. 5. However, with this method, the influence of the noise increases at the time of touch detection, as described at the beginning. The invention proposes a drive method in which display and touch detection are carried out at the driving timings shown in FIG. 5 while the noise from the TFT array can be reduced. In parallel with a video signal write period 502 executed throughout one vertical scanning period 501, touch detection is executed twice as indicated by 503, 504. At a certain moment t, a video signal write operation is carried out on one row in the display device, as indicated by a circle 511, whereas touch detection is carried out on a row in the touch sensor, as indicated by a circle 512. Details of this will be described below.

Figure 6A:
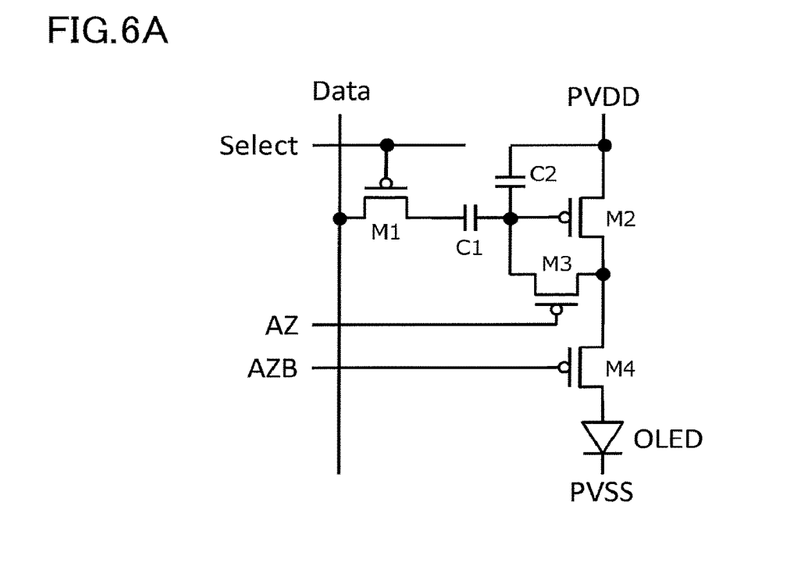
FIGS. 6A and 6B show an example of a pixel circuit of an organic EL display device.

FIG. 6A shows an example of a pixel circuit of an organic EL display device. According to this configuration, one subpixel includes four transistors (M1 to M4), two capacitors (C1, C2), three scanning lines (Select, AZ, AZB), and one video signal line (Data). It suffices that M1, M3, M4 can perform a switching operation, and therefore M1, M3, M4 are not limited to transistors. Power sources (PVDD, PVSS) for driving a light emitting element (OLED) are supplied to each subpixel.

Figure 6B:
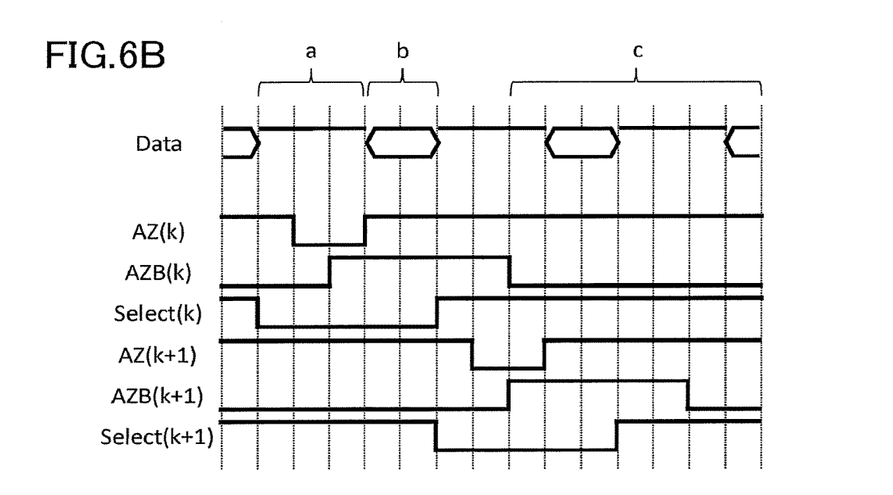

FIG. 6B shows drive timings of the pixel circuit shown in FIG. 6A. Here, only the operations on k-th and (k+1)th rows are shown.

During a period a, the scanning line (Select) drops to L level, thus making M1 electrically continuous and raising the gate potential of M2 via C1. Subsequently, the scanning line (AZ) drops to L level, thus making M3 electrically continuous and forming a short circuit between the gate and drain of M2. Moreover, the scanning line (AZB) rises to H level, thus making M4 electrically discontinuous and interrupting the current supply to OLED. With these operations, the gate of M2 is initialized and a potential difference corresponding to the threshold of M2 is generated between the gate and source.

During a period b, the video signal line (Data) changes the video signal potential on this row and changes the gate potential of M2 via the coupling of C1. At this time, the amount of change in the gate potential of M2 is decided by the combined capacitance of C1 and C2. The potential difference corresponding to the threshold of M2 is generated between the gate and source of M2 on the previous stage. Therefore, as the amount of change corresponding to the video signal potential is further provided to the gate of M2, the variance of threshold is canceled at each subpixel.

After the writing of video signals is completed, during a period c, the scanning line (AZB) drops to L level and supplies a current corresponding to the gate-source voltage of M2 to OLED, thus emitting light. This light emission continues until the next time the scanning line (AZB) rises to H level.

Figure 10A:
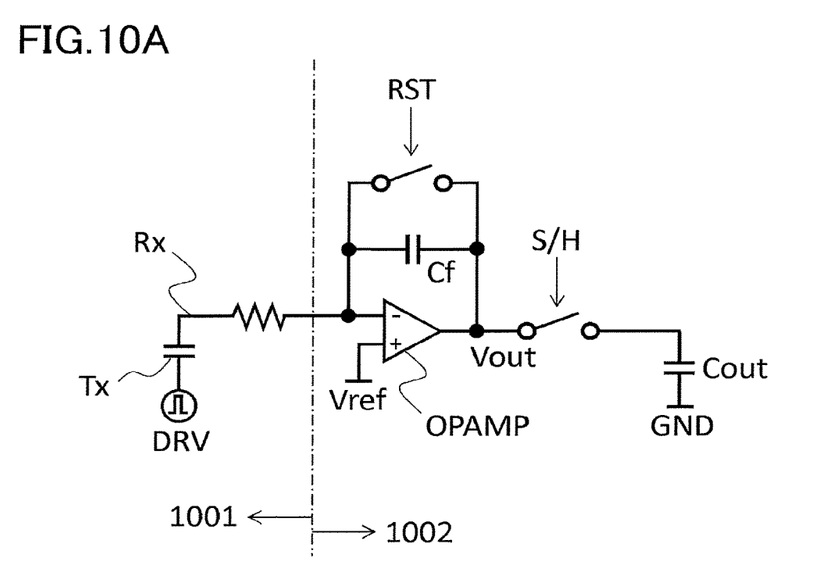
FIGS. 10A and 10B show the configuration of a touch sensor and a detection circuit, and an example of a timing of touch detection operation.
Figure 10B:
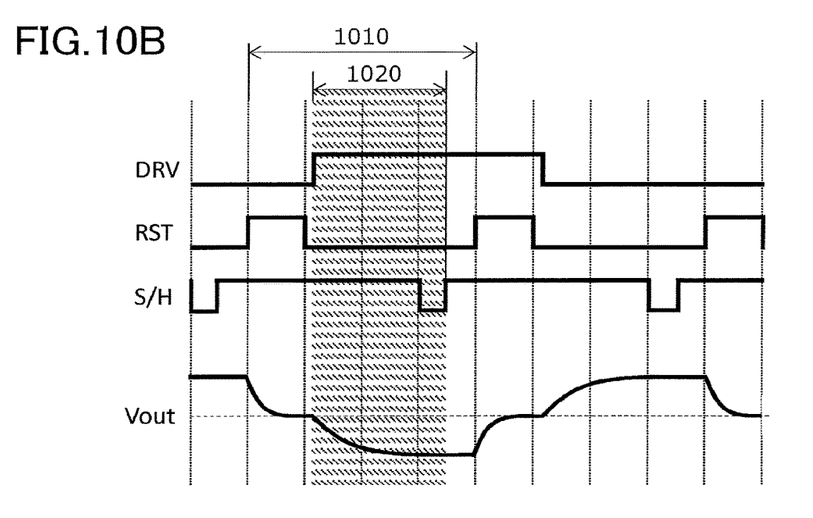

Next, the touch detection operation on the touch sensor will be described. FIG. 10A shows an example of the circuit configuration of a touch sensor and a detection system. The 1001 side of the dotted line shows a touch electrode provided over the display area, and the 1002 side shows a detection circuit. In the touch electrode, a detection electrode (Rx) and a drive electrode (Tx) form a coupling, as shown in FIG. 2. As a drive pulse is inputted from the side of the drive electrode (Tx), the potential of the detection electrode (Rx) fluctuates. The amount of this fluctuation varies depending on the presence/absence of a touch. In the detection circuit, the fluctuation at the detection electrode (Rx) is received by an integrator using an operational amplifier (OPAMP) and its output is taken in and held (Cout) in a sample and hold circuit. FIG. 10B shows drive timings of the detection circuit shown in FIG. 10A. In the detection circuit, as a reset signal (RST) is inputted, the output of the integrator is initialized.

Subsequently, when a rise or fall occurs in the drive signal on the side of the drive electrode (Tx), the potential of the detection electrode (Rx) fluctuates accordingly via the coupling. After a certain period of time, a sample and hold signal (S/H) is inputted and the output of the integrator is held. In FIG. 10B, the period denoted by 1010 indicates a touch detection operation for one row of drive electrodes (Tx). According to the invention, the operations from the rise/fall at the drive electrode (Tx) to the holding of the output, of the above operations, that is, the touch detection period denoted by 1020 in FIG. 10B, is incorporated in specific timings in the display operation, thus restraining the influence of a noise at the time of touch detection.

Figure 7:
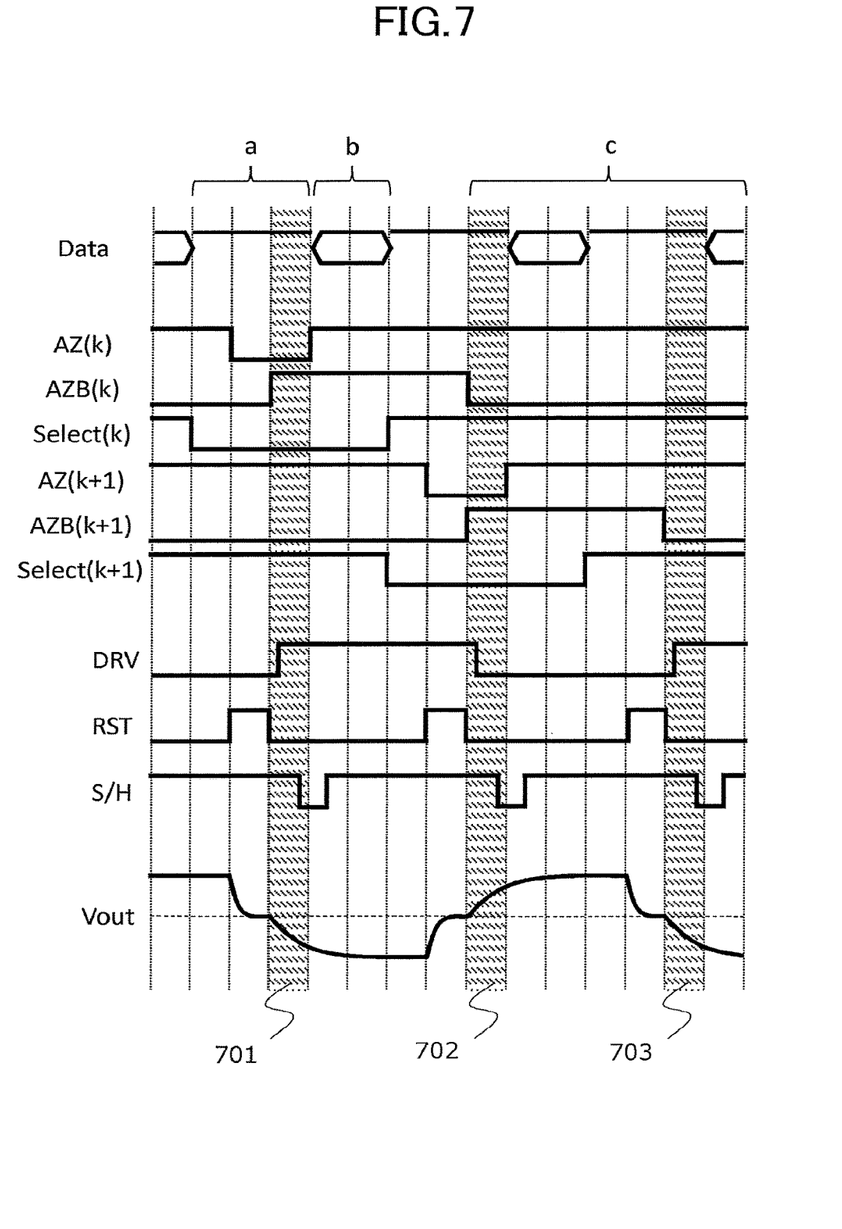
FIG. 7 shows an example of a timing when a display operation and touch detection are carried out in parallel.

FIG. 7 shows an example in which the touch detection operation described with reference to FIGS. 10A and 10B is incorporated in the drive timing of the pixel circuit described with reference to FIGS. 6A and 6B. During the end period of the period a, that is, during the periods denoted by 701, 702, 703, the potential of each scanning line and signal line are constant. Using these periods, the operations from the input of a drive signal (DRV) to the drive electrode (Tx) to the holding of the output are carried out.

Figure 8A:
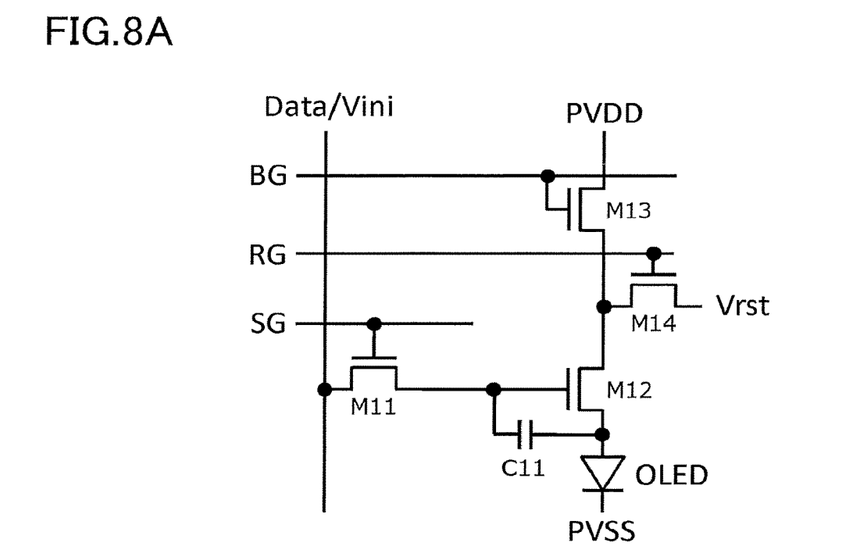
FIGS. 8A and 8B show an example of a pixel circuit of an organic EL display device.

FIG. 8A shows an example of a pixel circuit having a different configuration from FIGS. 6A and 6B, of the organic EL display device. In this configuration, one subpixel includes four transistors (M11 to M14), one capacitor (C11), three scanning lines (BG, RG, SG), and one video signal line (Data/Vini). It suffices that M11, M13, M14 can perform a switching operation, and therefore M11, M13, M14 are not limited to transistors. Power sources (PVDD, PVSS) and an initialization potential (Vrst) for driving a light emitting element (OLED) are supplied to each subpixel.

Figure 8B:
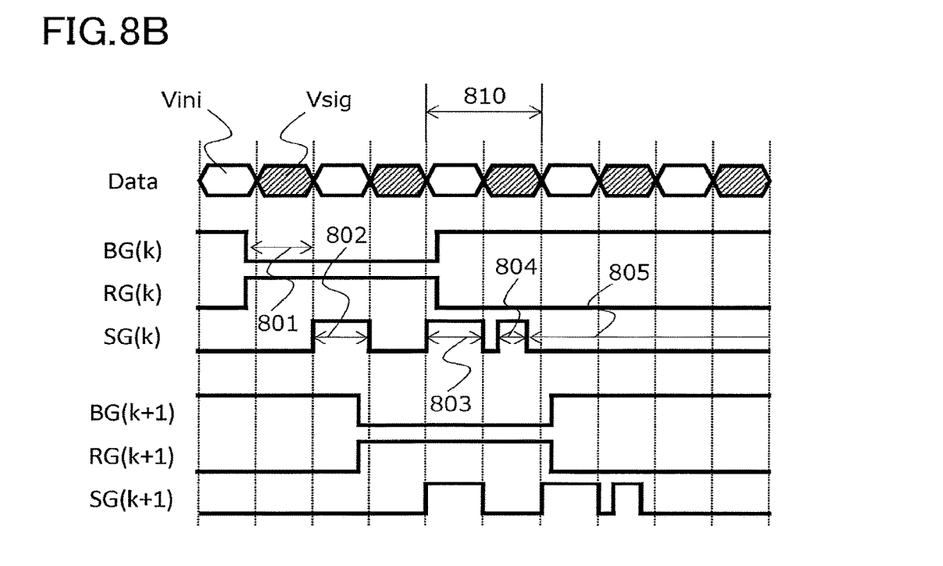

FIG. 8B shows drive timings of the pixel circuit shown in FIG. 8A. Here, only the operations on k-th and (k+1)th rows are shown.

In FIG. 8B, the period denoted by 810 is one horizontal period. During the former half of this period, an initialization signal (Vini) is inputted to the video signal line. During the latter half, a video signal (Data) is inputted to each row.

In FIG. 8B, during a period 801, the scanning line (BG) drops to L level and makes M13 electrically discontinuous, and the scanning line (RG) rises to H level and makes M14 electrically continuous. Thus, the current supply to OLED is interrupted and the source-drain potential of M12 becomes the initialization potential (Vrst).

During a period 802, the scanning line (SG) rises to H level and makes M11 electrically continuous. At this time, since the initialization signal (Vini) is inputted to the video signal line (Data), the initialization signal is inputted to the gate of M12 via the M11.

During a period 803, in the state where the initialization signal is inputted to the gate of M12, the scanning line (BG) rises to H level and the scanning line (RG) drops to L level. Thus, the source potential of M12 rises. With these operations, the gate of M12 is initialized and a potential difference corresponding to the threshold of M12 is generated between the gate and source.

During a period 804, a video signal (Vsig) is inputted to the gate of M12 via M11. Thus, the potential of the source of M12, which has temporarily stopped rising, rises again during the period 804. Since the speed of the potential rise at the source varies depending on the mobility of M12, the potential rise value at the source during the period 804 varies depending on the mobility. Therefore, with this operation, the variance in mobility of M12 is canceled.

As the period 804 ends, a period 805 starts immediately. In each subpixel, a current is supplied to OLED based on the gate-source voltage of M12 decided during the period 804, and the subpixel thus emits light. This light emission continues until the next time the scanning line (BG) drops to L level.

Figure 9:
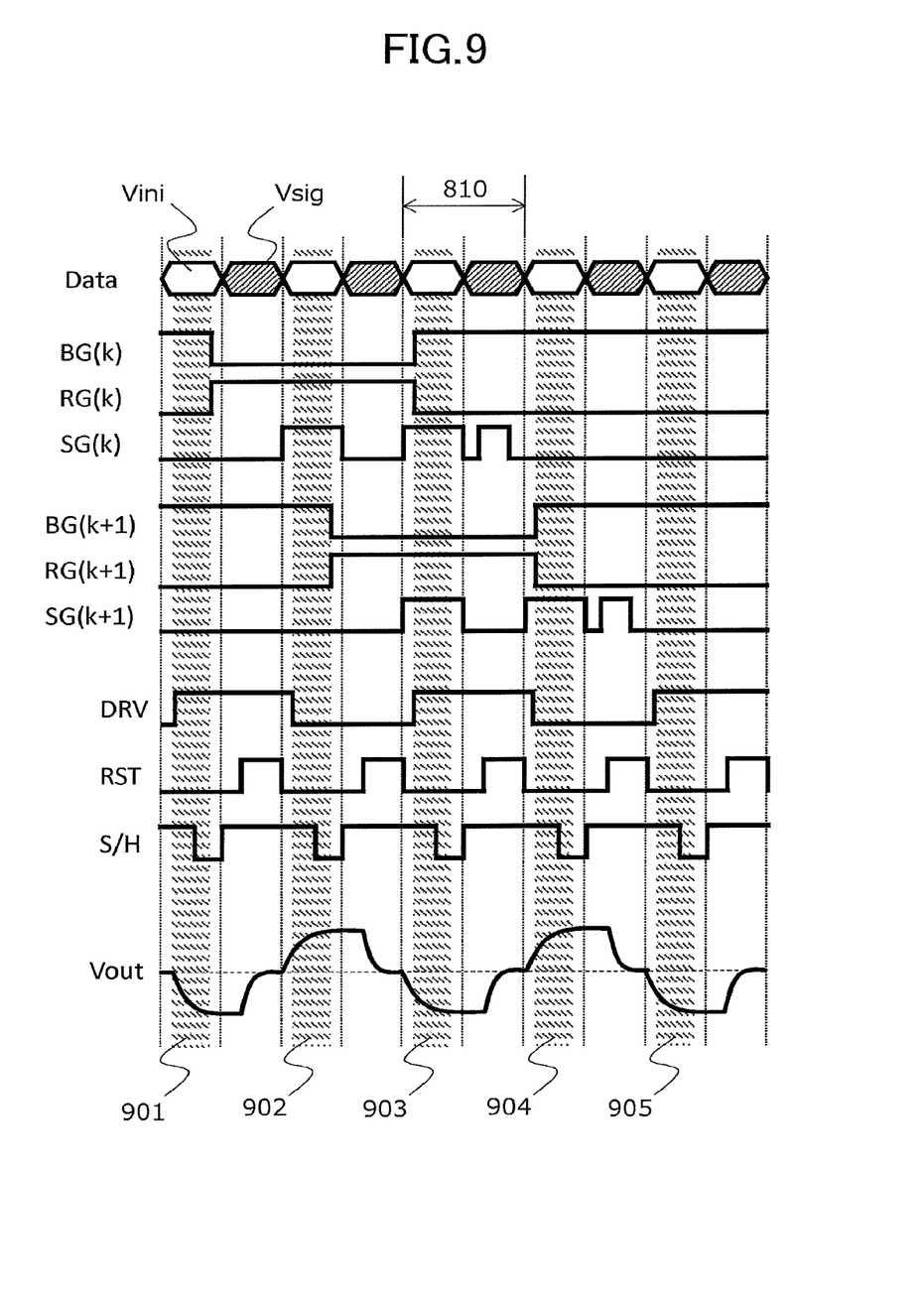
FIG. 9 shows an example of a timing when a display operation and touch detection are carried out in parallel according to the invention.

FIG. 9 shows an example in which the touch detection operation described with reference to FIGS. 10A and 10B is incorporated in the drive timing of the pixel circuit described with reference to FIGS. 8A and 8B. During a part of the one horizontal period 810, that is, a period during which the initialization signal (Vini) is inputted to the video signal line, an operation of acquiring the threshold of M12 on the k-th row is carried out and the initialization signal is inputted to the gate of M12 on the (k+1)th row. In this period, the period denoted by 903 is a period in which there is no potential fluctuation on each scanning line. Using this period, the operations from the input of a drive signal (DRV) to the drive electrode (Tx) to the holding of the output are carried out. In FIG. 9, the periods during which such operations can be carried out include 901, 902, 904, 905 as well as 903.

In general, the number of rows on the touch sensor side, that is, the number of drive electrodes (Tx), is smaller than the number of rows on the display device side, that is, the number of scanning lines. For example, the number of rows on the touch sensor side is 32 or 64, whereas the number of rows on the display device side is 1920. Therefore, if scanning of 32 rows is carried out twice on the touch sensor side while 1920 rows are scanned on the display device side during one vertical scanning period, the touch detection operation may be incorporated at the rate of scanning one row on the touch sensor side while scanning 30 rows on the display device side. Alternatively, in order to improve the accuracy of touch detection, the touch detection operation may be carried out a plurality of times per row. That is, during the period of scanning 30 rows on the display device side, the touch detection operation may be carried out 30 times on the same row on the touch sensor side and the average of these may be taken. In FIGS. 7 and 9, the timing of carrying out the touch detection operation once for each scanning of one row on the display device side is shown.

Figure 11:
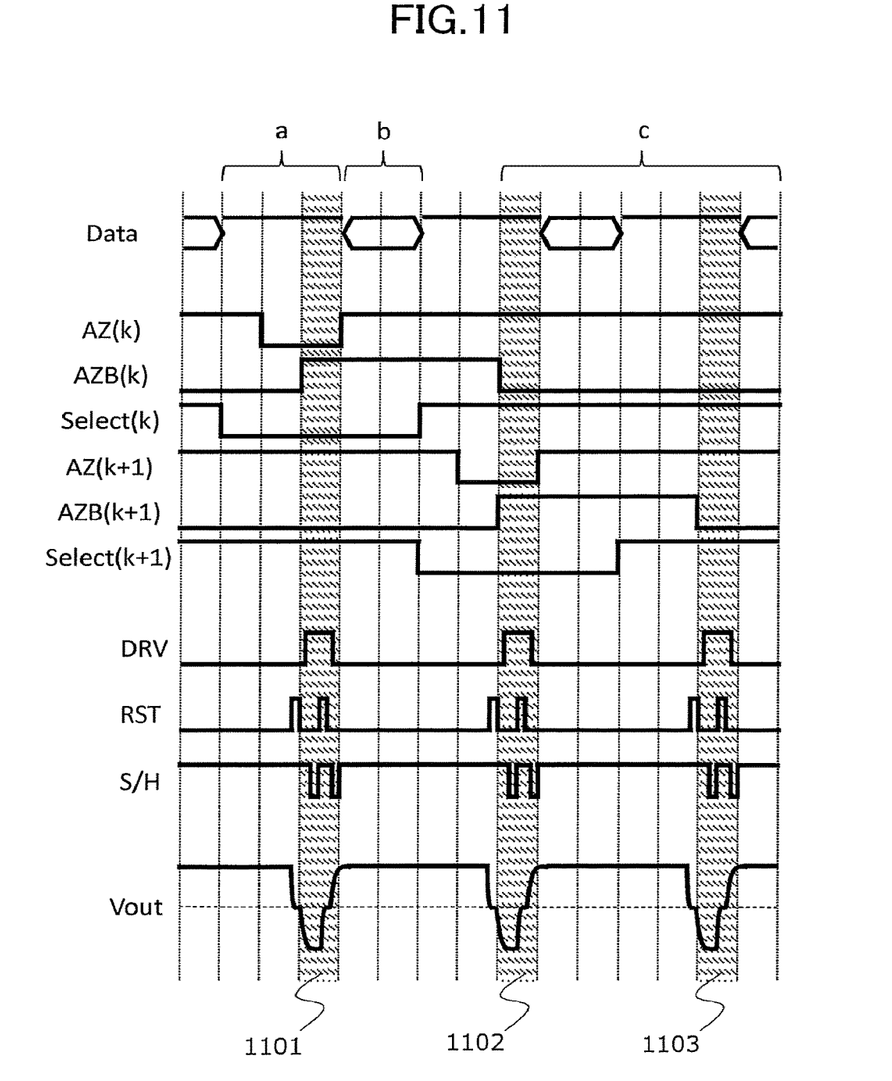
FIG. 11 shows a different example of the timing when a display operation and touch detection are carried out in parallel according to the invention.

FIG. 11 shows an example in which the touch detection operation is incorporated in the display period, at different timings from those shown in FIG. 7. In the example shown in FIG. 7, the drive electrode carries out either a rise operation or a fall operation during each of the periods 701 to 703, and the touch detection operation is carried out once accordingly. However, if the time constants of the drive electrode (Tx) and the detection electrode (Rx) are sufficiently small and the operation of the integrator is sufficiently fast, both of rise and fall may be performed at the drive electrode and the touch detection may be carried out twice during each of the periods 701 to 703.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a plurality of scanning lines provided over an insulating surface;
   a plurality of video signal lines provided, intersecting with the plurality of scanning lines;
   a display area including a plurality of pixels, each having a light emitting element and a transistor for controlling a current supplied to the light emitting element, provided at points of intersection between the plurality of scanning lines and the plurality of video signal lines; and
   a touch sensor provided over the display area and having a drive electrode and a detection electrode which form an electrostatic capacitance with each other,
   wherein between a first period during which one row of the plurality of scanning lines is selected and a second period during which a next row is selected in the display area, a touch detection period is configured to be provided in which a drive signal having a rise or fall is inputted to the drive electrode in the touch sensor and in which potential fluctuation at the detection electrode is acquired,
   during the touch detection period, each of the plurality of scanning lines and the plurality of video signals lines has a constant potential, and
   the drive signal has a third period stretching over a plurality of horizontal scanning periods of the display area.

2. The display device according to claim 1, wherein the rise and fall of the drive signal is included in one touch detection period.

3. The display device according to claim 1, wherein the plurality of video signal lines has an equal potential during the touch detection period.

4. The display device according to claim 1, wherein the touch detection period is included in a period for carrying out acquisition of a threshold voltage of the transistor in the display area.

5. A display device comprising:
   a plurality of scanning lines provided over an insulating surface;
   a plurality of video signal lines provided, intersecting with the plurality of scanning lines;
   a display area including a plurality of pixels, each having a light emitting element and a transistor for controlling a current supplied to the light emitting element, provided at points of intersection between the plurality of scanning lines and the plurality of video signal lines; and
   a touch sensor provided over the display area and having a drive electrode and a detection electrode which form an electrostatic capacitance with each other,
   wherein between a first period during which one row of the plurality of scanning lines is selected and a second period during which a next row is selected in the display area, a third period is configured to be provided in which a drive signal having a rise or fall is inputted to the chive electrode in the touch sensor,
   at the rise or fall of the drive signal, each of the plurality of scanning lines and the plurality of video signals lines has a constant potential, and
   the drive signal has a fourth period stretching over a plurality of horizontal scanning periods of the display area.

6. The display device according to claim 5, wherein the rise or fall of the drive signal is carried out during a period for acquiring a threshold voltage of the transistor.

7. A method for driving a display device, the display device comprising:
   a plurality of scanning lines provided over an insulating surface;
   a plurality of video signal lines provided, intersecting with the plurality of scanning lines;
   a display area including a plurality of pixels, each having a light emitting element and a transistor for controlling a current supplied to the light emitting element, provided at points of intersection between the plurality of scanning lines and the plurality of video signal lines; and a touch sensor provided over the display area and having a drive electrode and a detection electrode which form an electrostatic capacitance with each other, wherein a video is displayed in the display area via an initialization period during which a gate or source of the transistor has a constant potential, an offset cancellation period during which a potential difference corresponding to a threshold is generated between the gate and source of the transistor, a video signal write period during which a video signal is inputted to the gate of the transistor from the video signal line, and a light emission period during which the current is supplied to the light emitting element based on a gate-source voltage decided during the video signal write period, touch detection is carried out on the touch sensor via a touch detection period in which a drive signal having a rise or fall is inputted to the drive electrode and in which potential fluctuation at the detection electrode is acquired, and the touch detection period on one row in the touch sensor is included in the offset cancellation period on one row in the display area.

8. The method according to claim 7, wherein the rise or fall of the drive signal on one row in the touch sensor is carried out during the offset cancellation period in one row in the display area.

9. The method according to claim 7, wherein the touch detection on one row in the touch sensor is carried out again during the offset cancellation period on a next row in the display area.

10. The method according to claim 7, wherein the input of the drive signal on one row in the touch sensor is carried out again during the offset cancellation period on a next row in the display area.

* * * * *